(12) United States Patent
Lai et al.

(10) Patent No.: US 10,217,649 B2
(45) Date of Patent: Feb. 26, 2019

(54) SEMICONDUCTOR DEVICE PACKAGE HAVING AN UNDERFILL BARRIER

(71) Applicant: Advanced Semiconductor Engineering, Inc., Kaohsiung (TW)

(72) Inventors: Jin-Yuan Lai, Kaohsiung (TW); Tang-Yuan Chen, Kaohsiung (TW); Ying-Xu Lu, Kaohsiung (TW); Dao-Long Chen, Kaohsiung (TW); Kwang-Lung Lin, Kaohsiung (TW); Chih-Pin Hung, Kaohsiung (TW); Tse-Chuan Chou, Kaohsiung (TW); Ming-Hung Chen, Kaohsiung (TW); Chi-Hung Pan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/619,415

(22) Filed: Jun. 9, 2017

(65) Prior Publication Data
US 2018/0358238 A1   Dec. 13, 2018

(51) Int. Cl.
*H01L 23/49*   (2006.01)
*H01L 21/56*   (2006.01)
(Continued)

(52) U.S. Cl.
CPC ........ *H01L 21/563* (2013.01); *H01L 21/481* (2013.01); *H01L 23/49838* (2013.01); *H01L 23/49894* (2013.01); *H01L 24/16* (2013.01); *H01L 24/32* (2013.01); *H01L 24/73* (2013.01); *H01L 24/83* (2013.01); *H01L 2224/16235* (2013.01); *H01L 2224/32225* (2013.01); *H01L 2224/73204* (2013.01); *H01L 2224/83143* (2013.01); *H01L 2224/83493* (2013.01); *H01L 2224/83888* (2013.01); *H01L 2224/83889* (2013.01); *H01L 2924/01006* (2013.01)

(58) Field of Classification Search
CPC ........ H01L 23/49838; H01L 23/49894; H01L 24/16; H01L 24/32; H01L 24/73; H01L 24/83
See application file for complete search history.

(56) References Cited

U.S. PATENT DOCUMENTS 5,659,952 A * 8/1997 Kovac .................... H01L 21/56
                                              156/330
6,294,840 B1 * 9/2001 McCormick .......... H01L 21/563
                                              174/260

(Continued)

FOREIGN PATENT DOCUMENTS

TW            201034092 A        9/2010

*Primary Examiner* — Ida M Soward
(74) *Attorney, Agent, or Firm* — Foley & Lardner LLP; Cliff Z. Liu

(57) ABSTRACT

A semiconductor device package includes a substrate, a semiconductor device, and an underfill. The substrate includes a top surface defining a mounting area, and a barrier section on the top surface and adjacent to the mounting area. The semiconductor device is mounted on the mounting area of the substrate. The underfill is disposed between the semiconductor device and the mounting area and the barrier section of the substrate. A contact angle between a surface of the underfill and the barrier section is greater than or equal to about 90 degrees.

20 Claims, 5 Drawing Sheets

(51) Int. Cl.
  *H01L 23/00*   (2006.01)
  *H01L 21/48*   (2006.01)
  *H01L 23/498*  (2006.01)

(56) References Cited

U.S. PATENT DOCUMENTS

| | | | | |
|---|---|---|---|---|
| 6,391,683 B1 * | 5/2002 | Chiu | H01L 21/563 | 257/678 |
| 6,400,036 B1 * | 6/2002 | Tang | H01L 21/563 | 257/738 |
| 6,433,412 B2 * | 8/2002 | Ando | H01L 21/563 | 257/676 |
| 6,566,612 B2 * | 5/2003 | Brouillette | H01L 21/563 | 174/261 |
| 6,570,259 B2 * | 5/2003 | Alcoe | H01L 21/563 | 174/539 |
| 6,821,878 B2 * | 11/2004 | Danvir | H01L 21/563 | 257/E21.503 |
| 7,359,211 B2 * | 4/2008 | Landeros | B23K 1/0016 | 361/760 |
| 7,547,579 B1 * | 6/2009 | Jiang | H01L 21/563 | 438/118 |
| 8,067,306 B2 * | 11/2011 | Yang | H01L 21/4853 | 257/E21.499 |
| 8,119,449 B2 * | 2/2012 | Sakurai | H01L 24/10 | 257/778 |
| 8,536,718 B2 * | 9/2013 | Ko | H01L 21/563 | 174/261 |
| 8,546,957 B2 * | 10/2013 | Ko | H01L 21/563 | 257/782 |
| 8,581,406 B1 * | 11/2013 | Robbins | H05K 3/3436 | 257/288 |
| 9,893,242 B2 * | 2/2018 | Ikeda | H01L 33/62 | |
| 2005/0189646 A1 * | 9/2005 | Akram | H01L 21/563 | 257/712 |
| 2005/0199989 A1 * | 9/2005 | Aoki | H01L 21/4867 | 257/678 |
| 2005/0206017 A1 * | 9/2005 | Starkston | H01L 21/563 | 257/797 |
| 2008/0150099 A1 * | 6/2008 | Landeros | B23K 1/0016 | 257/666 |
| 2008/0237810 A1 * | 10/2008 | Subramanian | B05D 5/00 | 257/629 |
| 2008/0315410 A1 * | 12/2008 | Johnson | H01L 21/563 | 257/737 |
| 2009/0310322 A1 * | 12/2009 | Koh | H01L 21/563 | 361/783 |
| 2012/0159118 A1 * | 6/2012 | Wong | H01L 25/105 | 712/1 |
| 2014/0048934 A1 * | 2/2014 | Chen | H01L 21/563 | 257/738 |
| 2014/0061707 A1 * | 3/2014 | Livesay | H01L 33/64 | 257/98 |
| 2014/0061902 A1 * | 3/2014 | Ramalingam | H01L 23/49816 | 257/738 |
| 2015/0173177 A1 * | 6/2015 | Nagar | H01L 21/563 | 361/760 |
| 2017/0033075 A1 * | 2/2017 | Shu | H01L 23/3142 | |
| 2017/0287735 A1 * | 10/2017 | Yao | H01L 21/563 | |
| 2017/0301663 A1 * | 10/2017 | Lin | H01L 25/50 | |
| 2017/0330862 A1 * | 11/2017 | Choe | H01L 25/0657 | |
| 2017/0338206 A1 * | 11/2017 | Seo | H01L 25/0657 | |
| 2018/0233423 A1 * | 8/2018 | Lobianco | H01L 23/315 | |

* cited by examiner

SEMICONDUCTOR DEVICE PACKAGE HAVING AN UNDERFILL BARRIER

BACKGROUND

1. Technical Field

The present disclosure relates to a semiconductor device package, and more particularly, to a semiconductor device package for avoiding or reducing underfill overflow.

2. Description of the Related Art

In recent years, as electronic products being developed become thinner and smaller, the demand for multi-functioned, high-speed, high-density, and high-input/output-throughput semiconductor package structures increases significantly. As a result, a flip-chip semiconductor package structure is now widely utilized in high-performance electronic products and portable electronic products.

Within a flip-chip semiconductor package structure, a semiconductor device (e.g. a flip-chip type die) has multiple solder bumps at its active surface, and a substrate of the package structure has multiple solder pads. The solder bumps of the semiconductor device are bonded to the solder pads of the substrate by a reflow soldering process such that the semiconductor device is mounted to the substrate and electrically connected to a conductive pattern of the substrate. Further, an underfill is applied under the semiconductor device and/or between the semiconductor device and the substrate so as to tightly join the semiconductor device and the substrate. However, in the underfill process, the underfill may bleed or overflow to another area (which may have, e.g., other conductive structures such as pads, traces, etc.) on the substrate and cause undesired issues such as short circuit.

SUMMARY

According to at least some embodiments of the present disclosure, a semiconductor device package comprises a substrate, a semiconductor device, and an underfill. The substrate includes a top surface defining a mounting area, and a barrier section on the top surface and adjacent to the mounting area. The semiconductor device is mounted on the mounting area of the substrate. The underfill is disposed between the semiconductor device and the mounting area and the barrier section of the substrate. A contact angle between a surface of the underfill and the barrier section is greater than or equal to about 90 degrees.

According to at least some embodiments of the present disclosure, a substrate for a semiconductor device package comprises a dielectric layer having a first surface, a conductive pattern disposed in the dielectric layer, and a barrier section in the dielectric layer and exposed from the first surface of the dielectric layer. The surface of the barrier section is hydrophobic or super-hydrophobic.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Figure 1A:
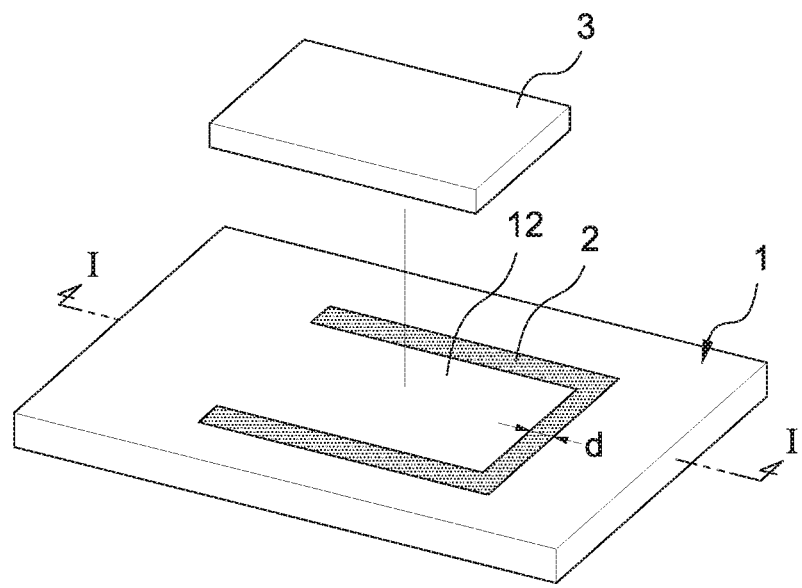
FIG. 1A illustrates a perspective view of a substrate and a semiconductor device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The aforementioned illustrations and following detailed descriptions are exemplary for the purpose of further explaining the scope of the instant disclosure. Other objectives and advantages related to the instant disclosure will be illustrated in the subsequent descriptions and appended drawings.

FIG. 1A shows a substrate 1 and a semiconductor device 3 in accordance with some embodiments of the present disclosure, wherein a semiconductor device package includes the substrate 1 and the semiconductor device 3 to be mounted on the substrate 1. As shown in FIG. 1A, a top surface of the substrate 1 defines a mounting area 12, on which the semiconductor device 3 is to be mounted. A barrier section 2 adjacent to the mounting area 12 may be hydrophobic. In some embodiments, the barrier section 2 is continuously formed along at least three edges of the mounting area 12. Alternatively, the barrier section 2 may fully surround the mounting area 12 (not shown).

In addition, the barrier section 2 can be linear or wavy (not shown). Moreover, a width d of the barrier section 2 may be greater than or equal to, e.g., about 2 μm, about 5 μm, about 10 μm, about 20 μm, or about 50 μm. In some embodiments, the width d of the barrier section may range, e.g., from about 2 µm to about 50 µm, from about 10 µm to about 40 µm, or from about 10 µm to about 30 µm.

Figure 1B:
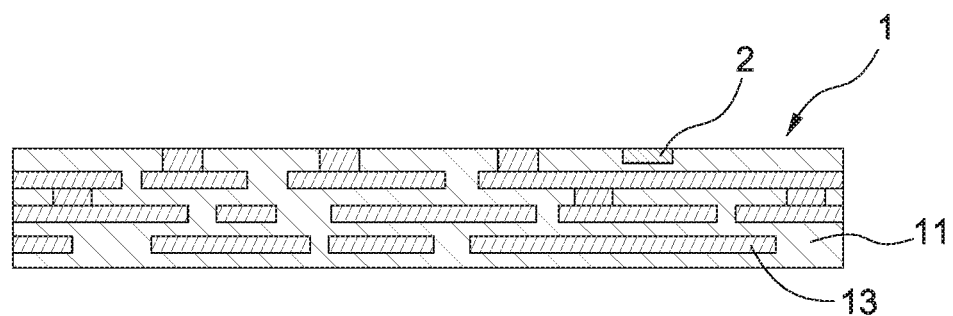
FIG. 1B illustrates a cross-sectional view along line I-I in FIG. 1A.

FIG. 1B shows a cross-sectional view of the substrate 1 along line I-I as shown in FIG. 1A. As shown in FIG. 1B, the substrate 1 comprises a dielectric layer 11 and a conductive pattern 13. The barrier section 2 is disposed in the dielectric layer 11 and exposed from a top surface of the dielectric layer 11. In some embodiments, a top surface of the barrier section 2 is substantially coplanar with the top surface of the dielectric layer 11.

In some embodiments, a surface treatment can be applied to the top surface of the barrier section 2 such that a plurality of holes and/or protrusions are formed on the top surface of the barrier section 2. Due to the holes and/or protrusions formed on the top surface of the barrier section 2, the top surface of the barrier section 2 has a nano-scale (also referred to as nanometer-scale, e.g., in a range of about 1 nm to about 1 µm) roughness or a micro-scale (also referred to as micrometer-scale, e.g., in a range of about 1 µm to about 100 µm) roughness. In addition, the roughness of the top surface of the barrier section 2 causes the barrier section 2 to be hydrophobic. The surface treatment applied to the top surface of the barrier section 2 can be, e.g., surface depositing, surface coating, and so forth. Moreover, the holes and/or the protrusions formed on the top surface of the barrier section 2 may be arranged to form a microstructure array on the top surface of the barrier section 2, such as a cylindrical microstructure array, a cubic microstructure array, a conical microstructure array, a cross-shaped microstructure array, and so forth. A root-mean-square (RMS) surface roughness of the barrier section may be in a range from about 2 nm to about 10 µm, about 15 nm to about 5 µm, or about 5 nm to about 1 µm.

Alternatively, in some embodiments, the barrier section 2 can be created by applying a coating onto the top surface of the dielectric layer 11. The material of the coating may comprise, e.g., about 20% to about 100% vol. (volume) of a polymer material and about 0 to about 80% vol. of nano-scale particles (or nano-particles). In some embodiments, the polymer material may comprise silane but may exclude sulfur, chorine and fluorine, wherein the silane is used to improve the bonding between the coating of the barrier section 2 and the substrate 1. In some embodiments, the nano-particles can be, e.g., silicon dioxide particles, silicon nitride particles, other ceramic particles, or a combination thereof.

Figure 2:
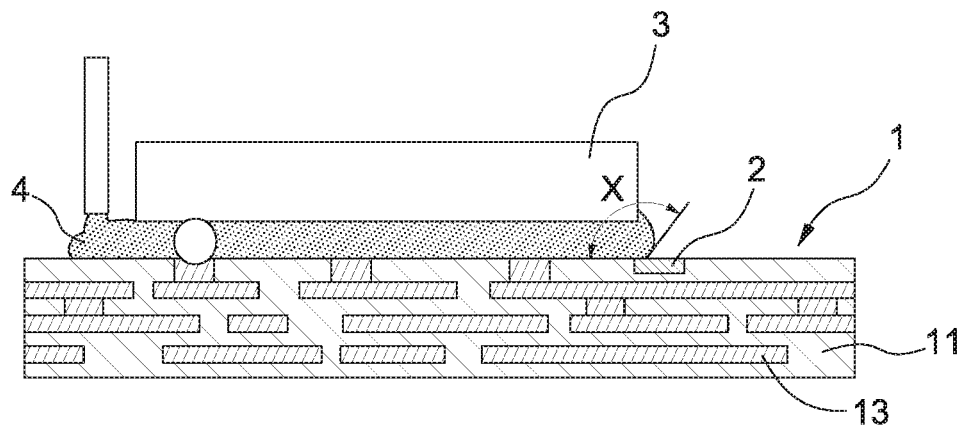
FIG. 2 illustrates a cross-sectional view of a semiconductor device package including a filled underfill, in accordance with some embodiments of the present disclosure.

FIG. 2 is a cross-sectional view of a semiconductor device package including a filled underfill 4, in accordance with some embodiments of the present disclosure. As shown in FIG. 2, the semiconductor device 3 is mounted on the mounting area 12 of the substrate 1 and the underfill 4 is filled between the semiconductor device 3 and the substrate 1. The flow of the underfill 4 enters the space between the semiconductor device 3 and the substrate 1 and then stops at the hydrophobic surface of the barrier section 2 on the substrate 1. As a result, the underfill 4 does not overflow to and does not infiltrate other areas of the substrate 1. In some embodiments, when the underfill 4 is stopped at the barrier section 2, the contact angle X of the underfill 4 on the barrier section 2 may be greater than or equal to, e.g., about 90 degrees, about 100 degrees, about 110 degrees, or about 120 degrees. In some embodiments, the contact angle X of the underfill 4 is specified as an angle between the top surface of the barrier section 2 and a portion of an exposed surface of the underfill 4 that is immediately above or adjacent to the barrier section 2.

Figure 3A:
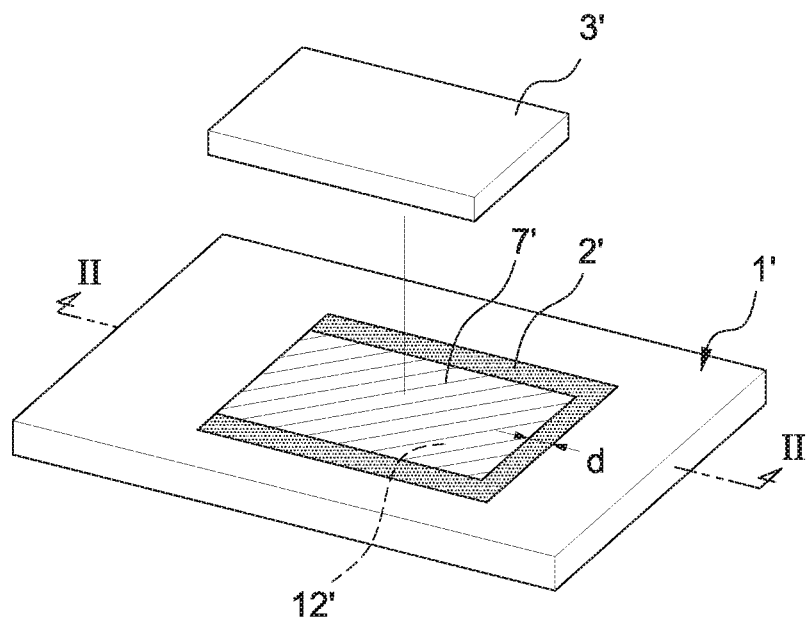
FIG. 3A illustrates a perspective view of a substrate and a semiconductor device in accordance with some embodiments of the present disclosure.

FIG. 3A shows a substrate 1' and a semiconductor device 3' in accordance with some other embodiments of the present disclosure, wherein a semiconductor device package includes the substrate 1' and the semiconductor device 3' to be mounted on the substrate 1'. As shown in FIG. 3A, a top surface of the substrate 1' defines a mounting area 12', on which the semiconductor device 3' can be mounted. Further, a trapper area 7' with hydrophilicity or super-hydrophilicity is formed within the mounting area 12'. Thus, when the semiconductor device 3' is mounted on the mounting area 12' of the substrate 1', the semiconductor device 3' is disposed on at least a portion of the hydrophilic trapper area 7'. Moreover, a barrier section 2' adjacent to the trapper area 7' is hydrophobic (or super-hydrophobic). The barrier section 2' is continuously formed along at least three edges of the trapper area 7'. Alternatively, the barrier section 2' can fully surround the tapper area 7' (not shown).

In addition, the barrier section 2' can be linear or wavy (not shown). Moreover, a width d of the barrier section 2' may be greater than or equal to, e.g., about 2 µm, about 5 µm, about 10 µm, about 20 µm, or about 50 µm. In some embodiments, the width d of the barrier section may range, e.g., from about 2 µm to about 50 µm, from about 10 µm to about 40 µm, or from about 10 µm to about 30 µm.

Figure 3B:
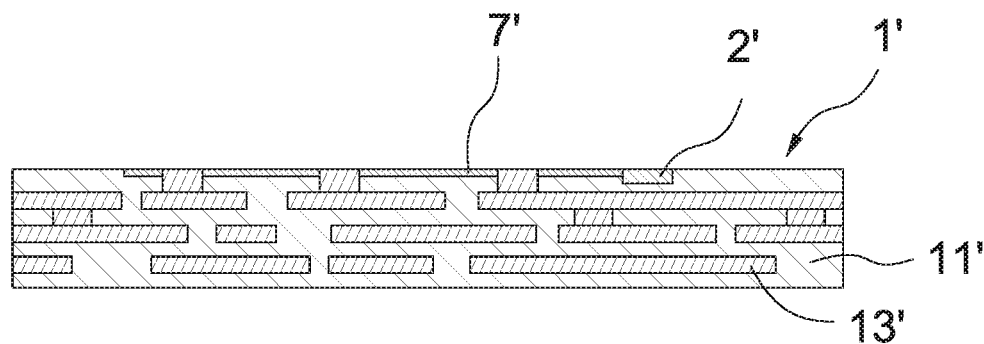
FIG. 3B illustrates a cross-sectional view along line II-II in FIG. 3A.

FIG. 3B shows a cross-sectional view of the substrate 1' along line II-II as shown in FIG. 3A. The substrate 1 comprises a dielectric layer 11' and a conductive pattern 13'. As shown in FIG. 3B, the barrier section 2' is disposed in the dielectric layer 11' and exposed from a top surface of the dielectric layer 11'. In some embodiments, the top surface of the barrier section 2' is substantially coplanar with the top surface of the dielectric layer 11'. Further, the trapper section 7' is exposed from the top surface of the substrate 1' and adjacent to the barrier section 2'.

The hydrophilic (or super-hydrophilic) trapper section 7' can be created by applying a coating on the top surface of the mounting area 12' or providing a film on the top surface of the mounting area 12'. In some embodiments, the coating or the film can be activated by, e.g., ultraviolet (UV) radiation, plasma treatment, or heating a temperature-sensitive material.

Alternatively, the hydrophilic (or super-hydrophilic) trapper section 7' can be created by applying a hydrophilic or super-hydrophilic anti-fogging treatment coating on the top surface of the mounting area. The super-hydrophilic anti-fogging treatment coating may comprise, e.g., nano-scale silicon dioxide particles, nano-scale titanium dioxide particles, other hydrophilic particles, or a combination thereof. Alternatively, in some embodiments, the trapper section 7' can be created by applying a film with a nano-scale porous structure, such as a Nano-Clustering Silica (NCS) porous film.

In addition, the trapper section 7' is disposed on the mounting area 12' of the substrate 1' and the semiconductor device 3' is to be mounted on the mounting area 12'. The coating or film of the trapper section 7' is arranged such that it does not block bump pads of the substrate 1' so that the semiconductor device 3' is electrically connected to the substrate 1'.

In some embodiments, a surface treatment can be applied to the top surface of the barrier section 2' such that a plurality of holes and/or protrusions are formed on the top surface of the barrier section 2'. Due to the holes and/or protrusions formed on the top surface of the barrier section 2', the top surface of the barrier section 2' has a nano-scale (also referred to as nanometer-scale) roughness or a micro-scale (also referred to as micrometer-scale) roughness. In addition, the roughness of the top surface of the barrier section 2' causes the barrier section 2' to be hydrophobic. The surface treatment applied to the top surface of the barrier section 2' can be, e.g., surface depositing, surface coating, and so forth. Moreover, the holes and/or the protrusions formed on the top surface of the barrier section 2' may be arranged to form a microstructure array on the top surface of the barrier section 2', such as a cylindrical microstructure array, a cubic microstructure array, a conical microstructure array, a cross-shaped microstructure array, and so forth. A RMS surface roughness of the barrier section may be in a range from about 2 nm to about 10 µm, about 15 nm to about 5 µm, or about 5 nm to about 1 µm.

Alternatively, in some embodiments, the barrier section 2' can be created by applying a coating onto the top surface of the dielectric layer 11. The material of the coating may comprise, e.g., about 20% to about 100% vol. of a polymer material and about 0 to about 80% vol. of nano-particles. In some embodiments, the polymer material may comprise silane but may exclude sulfur, chorine and fluorine, wherein the silane is used to improve the bonding between the coating of the barrier section 2' and the substrate 1'. In some embodiments, the nano-particles can be, e.g., silicon dioxide particles, silicon nitride particles, other ceramic particles, or a combination thereof.

Figure 4:
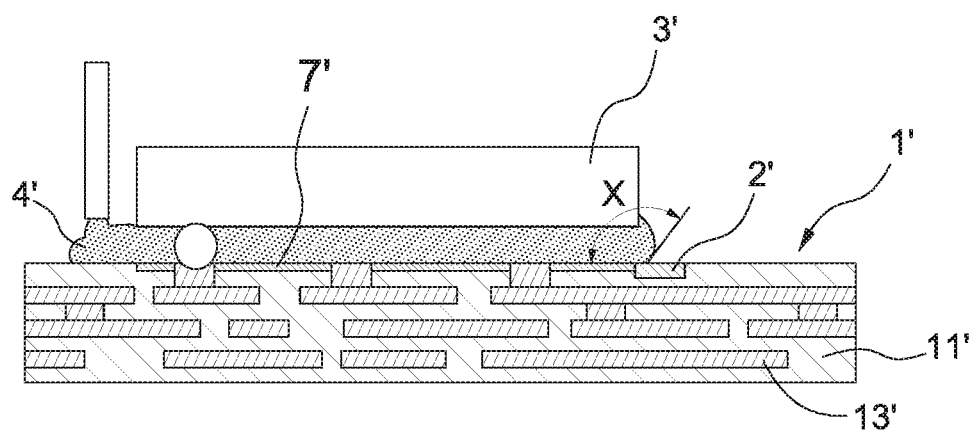
FIG. 4 illustrates a cross-sectional view of a semiconductor device package including a filled underfill, in accordance with some embodiments of the present disclosure.

FIG. 4 is a cross-sectional view of a semiconductor device package including a filled underfill, in accordance with some embodiments of the present disclosure. As shown in FIG. 4, the semiconductor device 3' is mounted on the mounting area 12' of the substrate 1' and disposed on the trapper section 7'. The underfill 4' is filled between the semiconductor device 3' and the trapper section 7' of the substrate 1'. The flow of the underfill 4' enters the space between the semiconductor 3' and the trapper section 7' of the substrate 1' and then stops at the barrier section 2' on the substrate 1'. The flow of the underfill 4' can pass through the space between the semiconductor 3 and the trapper section 7' of the substrate 1 due to the hydrophilic (or super-hydrophilic) trapper section 7'. Further, when the underfill 4' reaches the barrier section 2', the barrier section 2' stops the flow of the underfill 4' due to the hydrophobic property. As a result, the underfill 4' does not overflow and does not infiltrate other areas of the substrate 1'.

Moreover, because the trapper section 7' is hydrophilic (or super-hydrophilic), the contact angle of the underfill 4' on the trapper section 7' is smaller than about 90 degrees, especially wherein the contact angle of the underfill 4' on the trapper section 7' is about 80 degrees or less, about 50 degrees or less, about 20 degrees of less, or in the range of about 3 to about 5 degrees.

The contact angle X of the underfill 4' on the barrier section 2' may be greater than or equal to, e.g., about 90 degrees, about 100 degrees, about 110 degrees, or about 120 degrees. In some embodiments, the contact angle X of the underfill 4' is specified as an angle between the top surface of the barrier section 2' and a portion of an exposed surface of the underfill 4' that is immediately above or adjacent to the barrier section 2'.

The contact angle X of the underfill 4' on the barrier section 2' may be greater than or equal to, e.g., about 90 degrees, about 100 degrees, about 110 degrees, or about 120 degrees, as the underfill 4' is stopped on the barrier section 2'. In some embodiments, if the barrier section 2' is created by applying a film with nano-scale porous structure, the contact angle X of the underfill 4' on the barrier section 2' may be, e.g., about 120 degrees or greater, about 135 degrees or greater, or about 140 degrees or greater.

Figure 5A:
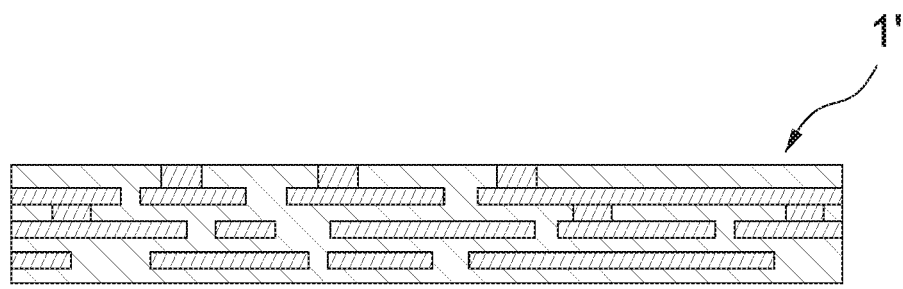
FIG. 5A illustrates a cross-sectional view showing one or more stages of a method of manufacturing a substrate, which includes a barrier section made by a graphene film and a trapper section made by a graphene oxide film, in accordance with some embodiments of the present disclosure.
Figure 5B:
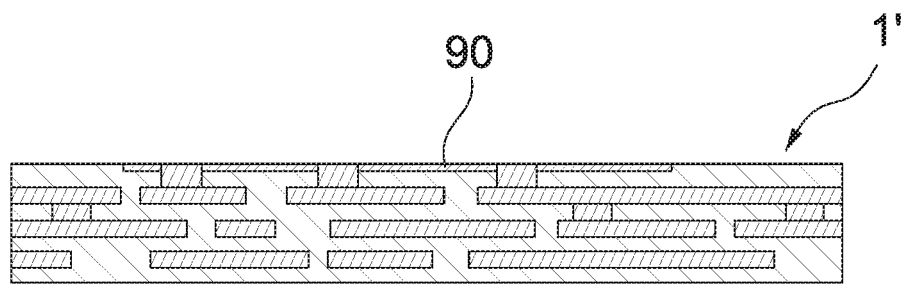
FIG. 5B illustrates a cross-sectional view showing one or more stages of a method of manufacturing a substrate, which includes a barrier section made by a graphene film and a trapper section made by a graphene oxide film, in accordance with some embodiments of the present disclosure.
Figure 5C:
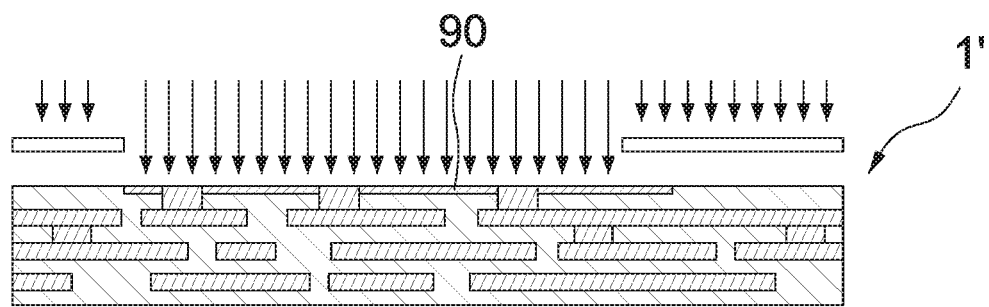
FIG. 5C illustrates a cross-sectional view showing one or more stages of a method of manufacturing a substrate, which includes a barrier section made by a graphene film and a trapper section made by a graphene oxide film, in accordance with some embodiments of the present disclosure.
Figure 5D:
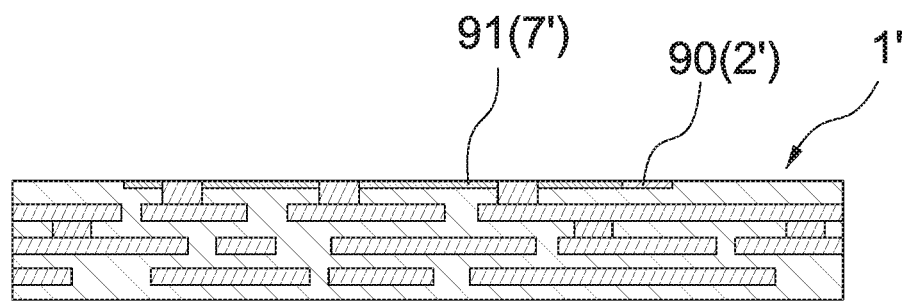
FIG. 5D illustrates a cross-sectional view showing one or more stages of a method of manufacturing a substrate, which includes a barrier section made by a graphene film and a trapper section made by a graphene oxide film, in accordance with some embodiments of the present disclosure.

According to at least some embodiments of the present disclosure, the substrate 1' includes the barrier section 2' made by a graphene film 90 and the trapper section 7' made by a graphene oxide film 91. FIGS. 5A-5D are cross-sectional views showing various stages of a method of manufacturing such substrate 1'. FIG. 5A shows the substrate 1' and FIG. 5B shows that a graphene film 90 is disposed on the top surface of the substrate 1'. In some embodiments, a top surface of the graphene film 90 is substantially coplanar with the top surface of the substrate 1'. The graphene film 90 substantially covers areas of the trapper section 7' and the barrier section 2'. Referring to FIG. 5C, a surface treatment is applied on a portion of the graphene film 90 above the trapper section 7' such that the portion of the graphene film 90 on the trapper section 7' is activated to form a graphene oxide film 91. Finally, the graphene film 90 which is not activated is configured to be the barrier section 2' of the substrate 1' and the graphene oxide film 91 is configured to be the trapper section 7' of the substrate 1'. The barrier section 2' made by the graphene film 90 may be hydrophobic or super-hydrophobic and the trapper section 7' made by the graphene oxide film 91 may be hydrophilic or super-hydrophilic. Further, the contact angle of the underfill on the barrier section 2' made by the graphene film 90 may be, e.g., about 120 degrees or greater, about 135 degrees or greater, or about 140 degrees or greater.

In the description of some embodiments, a component provided "on" or "above" or "on top of" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

While the present disclosure has been described and illustrated with reference to specific embodiments thereof, these descriptions and illustrations do not limit the present disclosure. It will be clearly understood by those skilled in the art that various changes may be made, and equivalents may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it should be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising;
   a substrate including:
      a top surface defining a mounting area, and
      a barrier section on the top surface and adjacent to the mounting area;
   a semiconductor device mounted on the mounting area of the substrate; and
   an underfill disposed between the semiconductor device and the mounting area of the substrate, wherein a contact angle between a surface of the underfill and the barrier section is greater than or equal to about 90 degrees.

2. The semiconductor device package of claim 1, wherein the barrier section is hydrophobic or super-hydrophobic.

3. The semiconductor device package of claim 1, wherein the barrier section has a nano-scale or micro-scale roughness.

4. The semiconductor device package of claim 1, wherein the barrier section includes a plurality of holes or protrusions.

5. The semiconductor device package of claim 1, wherein the barrier section is continuously formed along at least three edges of the mounting area.

6. The semiconductor device package of claim 1, wherein the top surface of the substrate is substantially coplanar with a surface of the barrier section.

7. The semiconductor device package of claim 1, wherein the barrier section includes a coating comprising a polymer material and nano-particles dispersed in the polymer material.

8. The semiconductor device package of claim 1, wherein the substrate further comprises a trapper section formed within the mounting area, wherein the trapper section is hydrophilic or super-hydrophilic.

9. The semiconductor device package of claim 8, wherein the trapper section includes a hydrophilic coating or film.

10. The semiconductor device package of claim 8, wherein the trapper section includes a film including a nano-scale porous structure.

11. The semiconductor device package of claim 8, wherein the trapper section comprises a graphene oxide material.

12. The semiconductor device package of claim 11, wherein the barrier section comprises a graphene material.

13. The semiconductor device package of claim 1, wherein a width of the barrier section is greater than or equal to about 10 micrometers.

14. The semiconductor device package of claim 1, wherein the underfill ends at an edge of the barrier section.

15. A substrate for a semiconductor device package, comprising:
   a dielectric layer having a first surface;
   a conductive pattern disposed in the dielectric layer; and
   a barrier section in the dielectric layer and exposed from the first surface of the dielectric layer, wherein a surface of the barrier section is hydrophobic or super-hydrophobic.

16. The substrate of claim 15, wherein the first surface defines a mounting area configured to mount a semiconductor device, and the barrier section is continuously formed along at least three edges of the mounting area.

17. The substrate of claim 15, further comprising:
   a trapper section in the dielectric layer, exposed from the first surface of the dielectric layer, and adjacent to the barrier section, wherein the trapper section is hydrophilic or super-hydrophilic.

18. The substrate of claim 15, wherein a width of the barrier section is greater than or equal to about 10 micrometers.

19. The substrate of claim 15, wherein the trapper section comprises a graphene oxide material.

20. The substrate of claim 19, wherein the barrier section comprises a graphene material.

* * * * *